(12) United States Patent
Leach

(10) Patent No.: US 10,123,412 B2
(45) Date of Patent: Nov. 6, 2018

(54) THERMOSETTING POLYMER FORMULATIONS, CIRCUIT MATERIALS, AND METHODS OF USE THEREOF

(71) Applicant: ROGERS CORPORATION, Rogers, CT (US)

(72) Inventor: Benjamin James Leach, Duarte, CA (US)

(73) Assignee: ROGERS CORPORATION, Rogers, CT (US)

(*) Notice: Subject to any disclaimer, the term of this patent is extended or adjusted under 35 U.S.C. 154(b) by 36 days.

(21) Appl. No.: 15/416,255

(22) Filed: Jan. 26, 2017

(65) Prior Publication Data

US 2017/0218171 A1   Aug. 3, 2017

Related U.S. Application Data

(60) Provisional application No. 62/288,107, filed on Jan. 28, 2016.

(51) Int. Cl.
*H05K 1/03* (2006.01)
*H05K 3/00* (2006.01)
(Continued)

(52) U.S. Cl.
CPC ............ *H05K 1/0353* (2013.01); *B05D 5/12* (2013.01); *C08J 5/043* (2013.01); *C08J 5/24* (2013.01);
(Continued)

(58) Field of Classification Search
CPC ... H05K 1/0353; H05K 1/0373; H05K 3/0058
See application file for complete search history.

(56) References Cited

U.S. PATENT DOCUMENTS 4,591,659 A   5/1986   Leibowitz
5,316,831 A   5/1994   Nakajima et al.
(Continued)

FOREIGN PATENT DOCUMENTS

JP   2007224269 A   9/2007
WO       9611105 A1   4/1996
WO    2010141432 A1   12/2010

OTHER PUBLICATIONS

CN102942878 (A); Publication date: Feb. 27, 2013; Daixin; Abstract; 1 page.
(Continued)

*Primary Examiner* — Jeremy C Norris
(74) *Attorney, Agent, or Firm* — Cantor Colburn LLP

(57) ABSTRACT

A thermosetting polymer formulation includes: 40 to 90 volume percent of a thermosetting polymer system; 10 to 40 volume percent, preferably 20 to 35 volume percent, preferably 20 to 30 volume percent, of a plurality of hexagonal boron nitride platelets having a mean particle diameter of 5 to 20 micrometers, preferably 8 to 15 micrometers, and a D10 particle diameter of 3 to 7 micrometers, preferably 3 to 5 micrometers, and a D90 particle diameter of 20 to 30 micrometers, preferably 25 to 30 micrometers; a total of 0.01 to 10 volume percent of a coupling agent, an impact modifier, a curing agent, a defoamer, a colorant, a thickening agent, a release agent, an accelerator, or a combination comprising at least one of the foregoing, wherein the volume percentages are based on the total volume of the formulation.

34 Claims, 2 Drawing Sheets

(51) Int. Cl.
*C08J 5/04* (2006.01)
*C08J 5/24* (2006.01)
*C08K 3/36* (2006.01)
*C08K 3/38* (2006.01)
*H05K 1/09* (2006.01)
*H05K 3/46* (2006.01)
*B05D 5/12* (2006.01)
*C09J 7/00* (2018.01)
*C09J 11/04* (2006.01)
*B32B 15/00* (2006.01)
*C08K 7/14* (2006.01)

(52) U.S. Cl.
CPC .............. *C08K 3/36* (2013.01); *C08K 3/38* (2013.01); *C09J 7/00* (2013.01); *C09J 11/04* (2013.01); *H05K 1/0373* (2013.01); *H05K 1/09* (2013.01); *H05K 3/00* (2013.01); *H05K 3/0058* (2013.01); *H05K 3/4644* (2013.01); *B32B 15/00* (2013.01); *C08J 2363/00* (2013.01); *C08J 2365/00* (2013.01); *C08K 7/14* (2013.01); *C08K 2003/385* (2013.01); *C08K 2201/001* (2013.01); *C08K 2201/003* (2013.01); *C09J 2201/622* (2013.01); *C09J 2203/326* (2013.01); *H05K 2201/0129* (2013.01)

(56) References Cited

U.S. PATENT DOCUMENTS

| 5,958,807 | A | 9/1999 | Kumar et al. |
| 8,187,696 | B2 | 5/2012 | Paul et al. |
| 8,809,690 | B2 | 8/2014 | Baars et al. |
| 8,921,458 | B2 | 12/2014 | Miyata et al. |
| 2002/0129951 | A1 | 9/2002 | Babb et al. |
| 2009/0142567 | A1 | 6/2009 | Kanakarajan et al. |
| 2010/0071936 | A1 | 3/2010 | Tan |
| 2010/0159244 | A1 | 6/2010 | Boussaad |
| 2010/0163783 | A1 | 7/2010 | Fung et al. |
| 2012/0118612 | A1 | 5/2012 | Smith et al. |
| 2014/0020933 | A1 | 1/2014 | Hedin et al. |
| 2014/0138128 | A1 | 5/2014 | Chang et al. |
| 2014/0353004 | A1 | 12/2014 | Jung et al. |
| 2015/0275063 | A1* | 10/2015 | Raman ............ C09K 5/14 252/75 |

OTHER PUBLICATIONS

CN104371318; Publication date: Feb. 25, 2015; Yinfeng et al.; Abstract; 1 page.
DE3711238; Publication date: Oct. 15, 1987; Hirokazu et al.; Abstract; 1 page.
JP2004200534 (A); Publication date: Jul. 15, 2004; Ikuo; Abstract; 1 page.
JP2015020947 (A); Publication date: Feb. 2, 2015; Hyun et al.; 1 page.
JP2923553 (B2); Publication date: Jul. 26, 1999; Taku et al.; Abstract; 1 page.
KR100688914 (B1); Publication date: Mar. 2, 2007; Abstract; 21 pages.
KR20140134087 (A); Publication date: Nov. 21, 2014; Chul et al.; Abstract; 1 page.
KR20140139685 (A); Publication date: Dec. 8, 2014; Sup et al.; Abstract; 1 page.
Raman et al.; Thermally Conductive But Electrically Insulating Plastics for Thermal Management Applications; Downloaded Jan. 26, 2017; 12 pages.
WO2012044029 (A2); Publication date: Apr. 5, 2012; Dong-Ki et al.; Abstract; 1 page.
"PolarTherm Boron Nitride Filler", Condensed Product Bulletin, Jun. 1, 2012, Retrieved from the Internet: URL:https://www.momentive.com/WorkArea/DownloadAsset.aspx?id=27492 [retrieved on Apr. 7, 2017], 2 pages, XP055362887.
"PolarTherm Boron Nitride Filler", Condensed Product Bulletin, Jan. 1, 2012, Retrieved from the Internet: URL: https://www.momentive.com/WorkArea/DownloadAsset.aspx?id=27490 [retrieved on Apr. 7, 2017], 2 Pages, XP055362883.
International Search Report for International Publication No. PCT/US2017/015021; International Filing Date: Jan. 26, 2017; dated Apr. 20, 2017; 6 Pages.
Written Opinion of the International Searching Authority for International Publication No. PCT/US2017/015021; International Filing Date: Jan. 26, 2017; dated Apr. 20, 2017; 7 Pages.

* cited by examiner

THERMOSETTING POLYMER FORMULATIONS, CIRCUIT MATERIALS, AND METHODS OF USE THEREOF

CROSS-REFERENCE TO RELATED APPLICATIONS

This application claims priority to U.S. provisional application Ser. No. 62/288,107, filed Jan. 28, 2016, the contents of which are hereby incorporated by reference.

BACKGROUND

It is desirable that dielectric layers used in select applications, circuit materials for example, meet electrical performance characteristics (e.g., low loss, low dielectric constant), physical performance characteristics (e.g., good heat resistance, good dimensional stability without substantial loss of other desirable performance properties, good adhesion to substrate(s), toughness), and also be environmentally friendly (e.g., halogen-free, lead-free, low volatile organic content).

There is a need for halogen-free, flame-retardant, highly thermally conductive, low dielectric constant thermosetting polymer formulations for use in dielectric layers including reducing the need for external metal or graphite heat sinks.

BRIEF DESCRIPTION

A thermosetting polymer formulation includes: 40 to 90 volume percent of a thermosetting polymer system; 10 to 40 volume percent, preferably 20 to 35 volume percent, preferably 20 to 30 volume percent, of a plurality of hexagonal boron nitride platelets having a mean particle diameter of 5 to 20 micrometers, preferably 8 to 15 micrometers, and a D10 particle diameter of 3 to 7 micrometers, preferably 3 to 5 micrometers, and a D90 particle diameter of 20 to 30 micrometers, preferably 25 to 30 micrometers; a total of 0.01 to 10 volume percent of a coupling agent, an impact modifier, a curing agent, a defoamer, a colorant, a thickening agent, a release agent, a cure accelerator, or a combination comprising at least one of the foregoing.

A dielectric layer for the manufacture of a dielectric substrate includes: a thermosetting polymer system; and 10 to 40 volume percent, preferably 20 to 35 volume percent, preferably 20 to 30 volume percent, based on the total volume of the dielectric layer, of a plurality of hexagonal boron nitride platelets having a mean particle diameter of 5 to 20 micrometers, preferably 8 to 15 micrometers, and a D10 particle diameter of 3 to 7 micrometers, preferably 3 to 5 micrometers, and a D90 particle diameter of 20 to 30 micrometers, preferably 25 to 30 micrometers; wherein after full cure of the dielectric layer, the dielectric layer has a dielectric constant of less than or equal to 4.5, preferably less than or equal to 4.0, measured over 1 MHz to 100 GHz; an in-plane thermal conductivity of greater than 0.5 Watts/meter·Kelvin, preferably greater than 2.0 Watts/meter·Kelvin; a z-axis thermal conductivity of 0.5 to 1.5 Watts/meter·Kelvin; and a thickness of less than or equal to 3.0 mils, preferably less than or equal to 2.5 mils, preferably less than or equal to 2.2 mils, preferably less than or equal to 2.0 mils, preferably 0.1 to 2.0 mils.

A circuit subassembly includes an electrically conductive layer disposed on a dielectric layer including a thermosetting polymer system; and 10 to 40 volume percent, preferably 20 to 35 volume percent, preferably 20 to 30 volume percent, based on the total volume of the dielectric layer, of a plurality of hexagonal boron nitride platelets having a mean particle diameter of 5 to 20 micrometers, preferably 8 to 15 micrometers, and a D10 particle diameter of 3 to 7 micrometers, preferably 3 to 5 micrometers, and a D90 particle diameter of 20 to 30 micrometers, preferably 25 to 30 micrometers.

A bond ply for a circuit subassembly includes: a first outer layer comprising a thermosetting polymer formulation; a second outer layer comprising a thermosetting polymer formulation that is of the same type as that of the first outer layer; and an intermediate layer disposed between the first and the second outer layers, and comprising a thermosetting polymer formulation that is of the same type as the first and second outer layers; wherein the thermosetting polymer formulation comprises: 40 to 90 volume percent of a thermosetting polymer system; 10 to 40 volume percent, preferably 20 to 35 volume percent, preferably 20 to 30 volume percent, based on the total volume of the dielectric layer, of a plurality of hexagonal boron nitride platelets having a mean particle diameter of 5 to 20 micrometers, preferably 8 to 15 micrometers, and a D10 particle diameter of 3 to 7 micrometers, preferably 3 to 5 micrometers, and a D90 particle diameter of 20 to 30 micrometers, preferably 25 to 30 micrometers; a total of 0.01 to 10 volume percent of a coupling agent, an impact modifier, a curing agent, a defoamer, a colorant, a thickening agent, a release agent, an accelerator, or a combination comprising at least one of the foregoing; wherein the thermosetting polymer formulation of the intermediate layer has a degree of cure that is different than a degree of cure for each of the thermosetting polymer formulations of the first and the second outer layers.

The above described and other features are exemplified by the following figures and detailed description.

BRIEF DESCRIPTION OF THE DRAWINGS

Referring now to the drawings, which are exemplary and not limiting.

DETAILED DESCRIPTION

Figure 1:
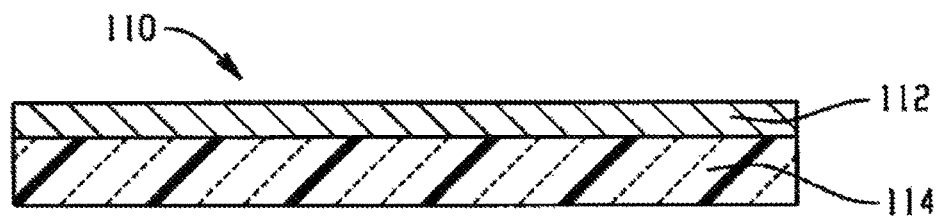
FIG. 1 is a schematic of a single clad laminate.

Described herein is a thermosetting polymer formulation, a dielectric layer including a thermosetting polymer formulation, and circuit materials including a dielectric layer. It was unexpectedly discovered by the inventors hereof that the use of a low volume percentage of hexagonal boron nitride platelets in a dielectric layer provided the dielectric layer with unexpectedly high thermal conductivity values and a low dielectric constant. Such dielectric layers are especially advantageous for circuit materials including dielectric substrates and bond ply applications.

The thermosetting polymer formulation includes 40 to 90 volume percent of a thermosetting polymer system; 10 to 40 volume percent, preferably 20 to 35 volume percent, preferably 20 to 30 volume percent, of a plurality of hexagonal boron nitride platelets having a mean particle diameter of 5 to 20 micrometers, preferably 8 to 15 micrometers, and a D10 particle diameter of 3 to 7 micrometers, preferably 3 to 5 micrometers, and a D90 particle diameter of 20 to 30 micrometers, preferably 25 to 30 micrometers; a total of 0.01 to 10 volume percent of a coupling agent, an impact modifier, a curing agent, a defoamer, a colorant, a thickening agent, a release agent, an accelerator, or a combination comprising at least one of the foregoing.

The thermosetting polymer formulation can include more than 60 volume percent of the thermosetting polymer system. The thermosetting polymer system can include a butadiene, an isoprene, a bis-maleimide, a styrene-maleic anhydride copolymer, an epoxy, a polyurethane prepolymer composition, a cyanate ester, a styrene butadiene copolymer, a benzoxazine, or a combination comprising at least one of the foregoing.

The thermosetting polymer system can be a multi-part thermosetting polymer system. The thermosetting polymer system can be a multi-part epoxy system, having 40 to 99 volume percent of an epoxy resin component and 15 to 60 volume percent of a curing system. The thermosetting epoxy system can be ionically cured. The curing system can be a thermal cure system. The curing system can include a phosphorus-containing phenolic hardener. The epoxy resin component can be a non-halogenated epoxy. The epoxy resin component can include two or more epoxy compounds. The epoxy resin component can be an epoxidized phenol novolac or an epoxidized cresol novolac. The multi-part epoxy system can include a liquid epoxy resin and a phenolic curing system. The thermosetting polymer formulation can include 35 to 45 volume percent of an epoxy resin component and 18 to 26 volume percent of a curing system. The thermosetting epoxy system used can have a glass transition temperature (Tg) higher than many epoxy systems used. A higher glass transition temperature is believed to provide better thermal and dimensional stability. The glass transition temperature for typical epoxy systems is around 140° C., and the thermosetting epoxy system used can be greater than 140° C., preferably between 140° C. and 170° C.

Hexagonal boron nitride platelets have a hexagonal crystalline structure (similar to that of graphite). The size of the hexagonal boron nitride platelets and the size distribution can vary, depending on the desired characteristics of the thermosetting polymer formulation or dielectric layer. Hexagonal boron nitride platelets can have a mean particle diameter of 5 to 20 micrometers, preferably 8 to 15 micrometers, and a D10 particle diameter of 3 to 7 micrometers, preferably 3 to 5 micrometers, and a D90 particle diameter of 20 to 30 micrometers, preferably 25 to 30 micrometers. The aspect ratio of the hexagonal boron nitride platelets can be between 5 and 300. The minimum aspect ratio of the hexagonal boron nitride platelets is 5. This aspect ratio can provide a low maximum packing fraction. The thermal conductivity of the system is related to both the total volume fraction and the maximum packing density. As the volume fraction of hexagonal boron nitride platelets approaches the maximum value, the thermal conductivity increases in a nonlinear manner, while the dielectric constant increases only with respect to the total volume fraction.

The loading level of hexagonal boron nitride platelets in the formulations and dielectric layers is limited by the maximum volume packing density. Hexagonal boron nitride platelets can be present in the compositions and dielectric layers at 10 to 40 volume percent, preferably 20 to 35 volume percent, and preferably 20 to 30 volume percent, based on the total volume percent of the dielectric layer. Other forms of hexagonal boron nitride, such as agglomerates, may be used.

The thermosetting polymer system can be any polymer or combination of polymers useful in a thermosetting polymer formulation or useful in a dielectric layer in a dielectric substrate. "Dielectric" is used to describe electrically insulating materials with good bond strength with circuit traces, low dielectric constant, low dielectric loss, high breakdown voltage, low moisture absorption, high thermal stability, or a combination comprising at least one of the foregoing. Useful thermosetting polymer systems can have good flexibility in the cured state, providing ease of processing in the manufacture of a bond ply and in use at a circuit processing facility. Exemplary thermosetting polymer systems can include, for example, polymers based on butadiene, isoprene, bis-maleimide, styrene-maleic anhydride copolymer, epoxy, urethane, cyanate ester, styrene butadiene copolymer, benzoxazine, or a combination comprising at least one of the foregoing.

The thermosetting polymer system can include a polybutadiene or polyisoprene polymer. A "polybutadiene or polyisoprene polymer" includes homopolymers derived from butadiene, homopolymers derived from isoprene, and copolymers derived from butadiene and/or isoprene and/or less than 50 volume percent of a monomer co-curable with the butadiene and/or isoprene. Suitable monomers co-curable with butadiene and/or isoprene include monoethylenically unsaturated compounds such as acrylonitrile, ethacrylonitrile, methacrylonitrile, alpha-chloroacrylonitrile, beta-chloroacrylonitrile, alpha-bromoacrylonitrile, $C_{1-6}$ alkyl (meth)acrylates (for example, methyl (meth)acrylate, ethyl (meth)acrylate, n-butyl (meth)acrylate, n-propyl (meth)acrylate, and isopropyl (meth)acrylate), acrylamide, methacrylamide, maleimide, N-methyl maleimide, N-ethyl maleimide, itaconic acid, (meth)acrylic acid, alkenyl aromatic compounds as described below, and combinations comprising at least one of the foregoing monoethylenically unsaturated monomers.

The thermosetting polymer system can include a polymer derived from bis-maleimide. Exemplary bis-maleimides include maleimides with the structure:

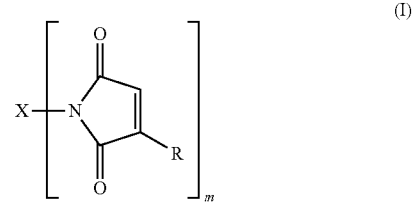

wherein: X is optionally substituted alkylene, cycloalkylene, arylene, polyarylene, heteroarylene or polyheteroarylene, each R is independently H or optionally substituted lower alkyl, and m is at least 2 (up to 10).

The thermosetting polymer system can include a styrene-maleic anhydride copolymer. Exemplary styrene-maleic anhydride co-polymers include alternating co-polymers of the structure: —[CH(Ph)-CH$_2$—SA]$_m$-; as well as block co-polymers of the same components, wherein Ph is an optionally substituted phenyl ring, SA is an optionally substituted succinic anhydride residue, and m is 5 to 200, preferably 10 to 100.

Various epoxy compounds can be used in the thermosetting polymer system. Examples include aromatic glycidyl ether compounds, such as bis(4-hydroxyphenyl)propane diglycidyl ether, bis(4-hydroxy-3,5-dibromophenyl)propane diglycidyl ether, bis(4-hydroxyphenyl)ethane diglycidyl ether, bis(4-hydroxyphenyl)methane diglycidyl ether, resorcinol diglycidyl ether, phloroglucinol triglycidyl ether, trihydroxybiphenyl triglycidyl ether, tetraglycidylbenzophenone, bisresorcinol tetraglycidyl ether, tetramethylbisphenol A diglycidyl ether, bisphenol C diglycidyl ether, bisphenol-hexafluoropropane diglycidyl ether, 1,3-bis[1-(2,3-epoxypropoxy)-1-trifluoromethyl-2,2,2-trifluoroethyl]benzene, 1,4-bis[1-(2,3-epoxypropoxy)-1-trifluoromethyl-2,2,2-trifluoromethyl]benzene, 4,4'-bis(2,3-epoxypropoxy)octafluorobiphenyl, phenol novolac bisepoxy compounds, alicyclic epoxy compounds, such as alicyclic diepoxy acetals, alicyclic diepoxy adipates, alicyclic diepoxy carboxylates, and vinylcyclohexene dioxide, glycidyl ester compounds, such as diglycidyl phthalate, diglycidyl tetrahydrophthalate, diglycidyl hexahydrophthalate, dimethylglycidyl phthalate, dimethylglycidyl hexahydrophthalate, diglycidyl-p-oxybenzoate, diglycidylcyclopentane-1,3-dicarboxylate, and glycidyl esters of dimer acids, glycidylamine compounds, such as diglycidylaniline, diglycidyltoluidine, triglycidylaminophenol, tetraglycidyldiaminodiphenylmethane, and diglycidyltribromoaniline, and heterocyclic epoxy compounds, such as diglycidylhydantoin, glycidylglycidoxyalkylhydantoin, and triglycidyl isocyanurate.

Examples of liquid epoxy compounds that can be used include polyalkylene ether type epoxy compounds, such as (poly)ethylene glycol diglycidyl ether, (poly)propylene glycol diglycidyl ether, and trimethylolpropane triglycidyl ether, glycidyl ester type epoxy compounds, such as diglycidyl esters of dimer acids, diglycycidyl phthalate, and diglycidyl tetrahydrophthalate, and homopolymers of glycidyl (meth)acrylate, allyl glycidyl ether, or the like, or copolymers of the monomers and other soft unsaturated monomers. The soft unsaturated monomers are such that homopolymers thereof have a glass transition temperature of less than 60° C. Examples of the soft unsaturated monomers can include methyl acrylate, ethyl acrylate, butyl(meth)acrylate, isobutyl (meth)acrylate, 2-ethylhexyl(meth)acrylate, and lauryl methacrylate.

The epoxy resin component can include a liquid epoxy resin, such as a phenol novolac epoxy resin, and a phenolic hardener. Example of phenolic hardeners include phenol aralkyl resins and naphthol aralkyl resins, novolac phenolic resins, such as phenol novolac resins and cresol novolac resins, and modified resins thereof, for example, epoxidized or butylated novolac phenolic resins, dicyclopentadiene-modified phenolic resins, para-xylene-modified phenolic resins, triphenolalkane phenolic resins, and other polyfunctional phenolic compounds such as 2-(dimethylaminomethylphenol), 2,4,6-tris(dimethylaminomethyl)phenol, and the tri-2-ethylhexyl hydrochloride of 2,4,6-tris(dimethylaminomethyl)phenol.

The thermosetting epoxy system can further include a curing system including a curing agent (a compound that reacts directly with the epoxy groups), an accelerator (a compound that promotes reaction), or both. A wide variety of compounds are known for use as curing agents and accelerators, including various amine compounds, such as aliphatic amines, alicyclic and heterocyclic amines, aromatic amines, and modified amines, imidazole compounds, imidazoline compounds, amide compounds, ester compounds, urea compounds, thiourea compounds, Lewis acid compounds, phosphorus compounds, acid anhydride compounds, onium salt compounds, and active silicon compound-aluminum complexes.

The thermosetting polymer system can include a polymer derived from urethane. A urethane prepolymer composition can include an isocyanate functional component, which can be prepared by reacting an excess of polyisocyanate with a polyol.

The thermosetting polymer system can include a polymer derived from a cyanate ester. Cyanate esters include dicyanatobenzenes, tricyanatobenzenes, dicyanatonaphthalenes, tricyanatonaphthalenes, dicyanato-biphenyl, bis(cyanatophenyl)methanes and alkyl derivatives thereof, bis(dihalocyanatophenyl)propanes, bis(cyanatophenyl)ethers, bis(cyanatophenyl)sulfides, bis(cyanatophenyl)propanes, phosphorus-containing cyanate esters (e.g., tris(cyanatophenyl)phosphites, or tris(cyanatophenyl)phosphates), bis(halocyanatophenyl)methanes, cyanated novolac, bis[cyanatophenyl(methylethylidene)]benzene, cyanated bisphenol-terminated thermoplastic oligomers, or a combination comprising at least one of the foregoing.

The thermosetting polymer system can include a styrene butadiene copolymer. Styrene butadiene copolymers can include a linear or graft-type block copolymer having a polybutadiene or polyisoprene block and a thermoplastic block that can be derived from a monovinylaromatic monomer such as styrene or alpha-methyl styrene. Block copolymers of this type include styrene-butadiene-styrene triblock copolymers, for example, those available from Dexco Polymers, Houston, Tex. under the trade name VECTOR 8508M, from Enichem Elastomers America, Houston, Tex. under the trade name SOT-T-6302, and those from Dynasol Elastomers under the trade name CALPRENE 401; and styrene-butadiene diblock copolymers and mixed triblock and diblock copolymers containing styrene and butadiene, for example, those available from Kraton Polymers (Houston, Tex.) under the trade name KRATON D1118. KRATON D1118 is a mixed diblock/triblock styrene and butadiene containing copolymer that contains 33% by weight styrene.

The thermosetting polymer system can include a polymer derived from benzoxazine. Benzoxazines can be obtained via ring-opening polymerization of oxazine rings of benzoxazine monomers. Examples of benzoxazine monomers include, but not limited to, those having a functional group, such as phenyl, methyl, or cyclohexyl, coupled to a nitrogen in an oxazine ring.

Examples of the aliphatic amines include ethylenediamine, trimethylenediamine, triethylenediamine, tetramethylenediamine, hexamethylenediamine, diethylenetriamine, triethylenetetramine, tetraethylenepentamine, dipropylenediamine, dimethylaminopropylamine, diethylaminopropylamine, trimethylhexamethylenediamine, pentanediamine, bis(2-dimethylaminoethyl)ether, pentamethyldiethylenetriamine, alkyl-t-monoamine, 1,4-diazabicyclo(2,2,2)octane (triethylenediamine), N,N,N',N'-tetramethylhexamethylenediamine, N,N,N',N'-tetramethylpropylenediamine, N,N,N',N'-tetramethylethylenediamine, N,N-dimethylcyclohexylamine, dibutylaminopropylamine, dimethylaminoethoxyethoxyethanol, triethanolamine, and dimethylaminohexanol.

Examples of the alicyclic and heterocyclic amines include piperidine, piperazine, menthanediamine, isophoronediamine, methylmorpholine, ethylmorpholine, N,N',N'''-tris(dimethylaminopropyl)hexahydro-s-triazine, a 3,9-bis(3-aminopropyl)-2,4,8,10-tetraoxyspiro(5,5)undecane adduct, N-aminoethylpiperazine, trimethylaminoethylpiperazine, bis(4-aminocyclohexyl)methane, N,N'-dimethylpiperazine, and 1,8-diazabicyclo[4.5.0]undecene-7.

Examples of the aromatic amines include o-phenylenediamine, m-phenylenediamine, p-phenylenediamine, diaminodiphenylmethane, diaminodiphenylsulfone, benzylmethylamine, dimethylbenzylamine, m-xylenediamine, pyridine, picoline, and α-methylbenzylmethylamine.

Examples of the modified amines include epoxy compound addition polyamines, Michael addition polyamines, Mannich addition polyamines, thiourea addition polyamines, ketone-blocked polyamines, dicyandiamide, guanidine, organic acid hydrazides, diaminomaleonitrile, aminimides, a boron trifluoride-piperidine complex, and a boron trifluoride-monoethylamine complex.

Examples of the amide compounds include polyamides obtained by the condensation of dimer acids and polyamines.

Examples of the ester compounds include active carbonyl compounds, such as aryl and thioaryl esters of carboxylic acids.

Examples of the urea compounds, the thiourea compounds, and the Lewis acid compounds include butylated urea, butylated melamine, butylated thiourea, and boron trifluoride.

Examples of the acid anhydride compounds include phthalic anhydride, tetrahydrophthalic anhydride, hexahydrophthalic anhydride, methyltetrahydrophthalic anhydride, methylhexahydrophthalic anhydride, endomethylenetetrahydrophthalic anhydride, methylendomethylenetetrahydrophthalic anhydride, maleic anhydride, tetramethylenemaleic anhydride, trimellitic anhydride, chlorendic anhydride, pyromellitic anhydride, dodecenylsuccinic anhydride, benzophenonetetracarboxylic anhydride, ethylene glycol bis(anhydrotrimellitate), glycerol tris(anhydrotrimellitate), methylcyclohexenetetracarboxylic anhydride, and polyazelaic anhydride.

Examples of the onium salt compounds and the active silicon compound-aluminum complexes include aryldiazonium salts, diaryliodonium salts, triarylsulfonium salts, a triphenylsilanol-aluminum complex, a triphenylmethoxysilane-aluminum complex, a silyl peroxide-aluminum complex, and a triphenylsilanol-tris(salicylaldehydato)aluminum complex.

Amine compounds, imidazole compounds, and phenol compounds are preferably used as the curing agent or curing accelerator. Among phenol compounds, phenolic resin curing agents are more preferably used.

Curing agents include various compounds used for cure of epoxy resins, including aliphatic amine compounds, aromatic amine compounds, acid anhydride compounds, dicyandiamide, complexes of boron trifluoride and an amine compound, or phenolic and novolac resins. Curing agents can be used either singly or as a combination. There may be more than one curing agent in a formulation, such as a dicyandiamide, and a novolac resin, for example. Curing agents such as peroxides, carbon-carbon, and azo initiators can be used for the free radical polymerization of polyenes having reactive olefinic sites. Curing agents can be present at 0.05 to 5 volume percent, preferably 0.1 to 1 volume percent, based on the total volume of the formulation.

Examples of curing agents for free radical polymerization include dibenzoyl peroxide; dicumyl peroxide; a,a'-bis(t-butylperoxy)diisopropylbenzene; 2,5-dimethyl-2,5-di(t-butylperoxy)-3-hexyne; 2,5-dimethyl-2,5-di(benzoylperoxy) hexane; 2,3-dimethyl-2,3-diphenylbutane; 2-2'-azobis(2,4-dimethylvaleronitrile); and azobisisobutyronitrile.

Examples of the imidazole compounds include imidazole, 1-methylimidazole, 2-methylimidazole, 3-methylimidazole, 4-methylimidazole, 5-methylimidazole, 1-ethylimidazole, 2-ethylimidazole, 3-ethylimidazole, 4-ethylimidazole, 5-ethylimidazole, 1-n-propylimidazole, 2-n-propylimidazole, 1-isopropylimidazole, 2-isopropylimidazole, 1-n-butylimidazole, 2-n-butylimidazole, 1-isobutylimidazole, 2-isobutylimidazole, 2-undecyl-1H-imidazole, 2-heptadecyl-1H-imidazole, 1,2-dimethylimidazole, 1,3-dimethylimidazole, 2,4-dimethylimidazole, 2-ethyl-4-methylimidazole, 1-phenylimidazole, 2-phenyl-1H-imidazole, 4-methyl-2-phenyl-1H-imidazole, 2-phenyl-4-methylimidazole, 1-benzyl-2-methylimidazole, 1-benzyl-2-phenylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, a 2-phenylimidazole isocyanuric acid adduct, a 2-methylimidazole isocyanuric acid adduct, 2-phenyl-4,5-dihydroxymethylimidazole, 2-phenyl-4-methyl-5-hydroxymethylimidazole, 1-cyanoethyl-2-phenyl-4,5-di(2-cyanoethoxy)methylimidazole, 1-dodecyl-2-methyl-3-benzylimidazolium chloride, and 1-benzyl-2-phenylimidazole hydrochloride.

Accelerators can be used to accelerate the curing process. Accelerators can be imidazole compounds such as 2-methyl imidazole compounds, 2-alkyl-4-methyl imidazole compounds, 2-alkyl-4-ethyl imidazole compounds, 2-phenyl imidazole compounds. These various accelerators can be used either singly or as a combination. Accelerators can be present at 0.05 to 5 volume percent, preferably 0.1 to 1 volume percent, based on the total volume of the formulation.

In some cases, the flame retardant is included in the thermosetting polymer system. Additional flame retardants may be used and include substantially halogen-free fire retardants, halogenated fire retardants, additive and/or reactive flame retardants which may serve as intumescents or char formers, silanes, siloxanes, low melting glasses, zinc-, boron-, aluminum-, or magnesium-based fire retardants.

Examples of the phosphorus compounds include organic phosphine compounds, for example, primary phosphines, such as alkylphosphines, such as ethylphosphine and butylphosphine, and phenylphosphine; secondary phosphines, such as dialkylphosphines, such as dimethylphosphine and dipropylphosphine, diphenylphosphine, and methylethylphosphine; tertiary phosphines, such as trimethylphosphine, triethylphosphine, triphenylphosphine, phosphates, phosphites, phosphazenes, phosphinates, oxaphosphorines, and oxazaphosphorines.

Flame retardants include, for example, hexabromocyclodecane, bis(dibromopropyl)tetrabromobisphenol A, tris(dibromopropyl) isocyanurate, tris(tribromoneopentyl) phosphate, decabromodiphenyl oxide, bis(pentabromo) phenylethane, tris(tribromophenoxy)triazine, ethylenebistetrabromophthalimide, polybromophenylindan, brominated polystyrene, tetrabromobisphenol A polycarbonate, brominated phenylene ethylene oxide, polypentabromobenzyl acrylate, triphenyl phosphate, tricresyl phosphate, trixylyl phosphate, cresyl diphenyl phosphate, xylyl diphenyl phosphate, cresyl bis(di-2,6-xylenyl) phosphate, 2-ethylhexyl diphenyl phosphate, resorcinol bis(diphenyl) phosphate, bisphenol A bis(diphenyl) phosphate, bisphenol A bis(dicresyl) phosphate, resorcinol bis(di-2,6-xylenyl) phosphate, tris(chloroethyl) phosphate, tris(chloropropyl) phosphate, tris(dichloropropyl) phosphate, tris(tribromopropyl) phosphate, diethyl-N,N-bis(2-hydroxyethyl)aminomethyl phosphonate, melamine polyphosphate, melamine cyanurate, 9,10-dihydro-9-oxa-phosphophenthrene-10-oxide, aluminum diethyl phosphinate, oxalate anion-treated aluminum hydroxide, nitrate-treated aluminum hydroxide, high temperature hot water-treated aluminum hydroxide, stannic acid surface-treated hydrated metal compounds, nickel compound surface-treated magnesium hydroxide, silicone polymer surface-treated magnesium hydroxide, phlogopite, multilayer surface-treated hydrated metal compounds, and cation polymer-treated magnesium hydroxide. A flame retardant, if used, can be present in the thermosetting polymer formulation, or can be a separate component, or both.

Additives can be included in the thermosetting polymer formulation, for example, coupling agents, impact modifiers, curing agents, defoamers, colorants, thickening agents, release agents, accelerators, or a combination comprising at least one of the foregoing. The particular choice of additive depends on the particular application, and the desired properties for that application, and the additives are selected so as to enhance or not substantially adversely affect the desired properties of the circuit material. The total volume percent of all additives combined can be 0.01 to 10 volume percent, based on the total volume of the thermosetting polymer formulation.

Impact modifiers can be used to improve fracture toughness in the cured composition, and can be reactive or nonreactive. Impact modifiers include compounds that reduce the brittleness of the formulation, such as, for example, branched polyalkanes or polysiloxanes that lower the glass transition temperature (Tg) of the formulation. Such impact modifiers include, for example, polyethers, polyesters, polythiols, or polysulfides. It can be advantageous to use a reactive adduct that has been modified with an elastomeric component. Such reactive adducts can be useful because they can be cross-linked into the primary thermosetting system in relatively small amounts without modifying the overall cure properties or the viscosity of the thermosetting system. Examples of such reactive adducts include epoxy adducts modified with carboxyl-terminated butadiene-acrylonitrile elastomers, such as EPON 58034 and EPON 58042 (available from Hexion Specialty Chemicals, Inc. of Houston, Tex.) or HyPox RF 1320, HyPox RF 1341, and HyPox RF928 (available from CVC Specialty Chemical, Inc. of Moorestown, N.J.). Additional examples include the elastomeric particulate tougheners available from Zeon Chemicals of Louisville, Ky. (marketed under the trade designation DuoMod). Nonreactive elastomer modifiers include various poly(acrylonitrile-co-butadienes) (NBRs), polybutadienes, chloroprene rubbers, silicones, crosslinked NBRs, crosslinked butyl rubbers (BRs), acrylics, core-shell acrylics, urethane rubbers, polyester elastomers, functional group-containing liquid NBRs, liquid polybutadienes, liquid polyesters, liquid polysulfides, modified silicones, and urethane prepolymers can be used. Impact modifiers can be present at 0.5 to 10 volume percent, preferably at 2 to 20 volume percent, based on the total volume of the formulation.

Coupling agents include materials which form a bridge between inorganic surfaces and reactive polymeric components, including materials such as epoxy silanes, or amino silanes. Silane coupling agents include vinyltrimethoxysilane, vinyltriethoxysilane, γ-glycidoxypropyltrimethoxysilane, γ-glycidoxypropyltriethoxysilane, γ-methacryloxypropyltrimethoxysilane, γ-methacryloxypropyltriethoxysilane, γ-aminopropyltrimethoxysilane, γ-aminopropyltriethoxysilane, N-β(aminoethyl)γ-aminopropyltrimethoxysilane, N-βaminoethyl)γ-aminopropyltriethoxysilane, N-phenyl-γ-aminopropyltrimethoxysilane, N-phenyl-γ-aminopropyltriethoxysilane, γ-mercaptopropyltrimethoxysilane, and γ-mercaptopropyltriethoxysilane. Coupling agents can be present at 0.01 to 2 volume percent, preferably 0.1 to 1 volume percent, based on the total volume of the formulation.

Defoamers include materials which inhibit formation of foam or bubbles when a liquid solution is agitated or sheared during processing. Exemplary defoamers contemplated for use herein include n-butyl alcohol, or silicon-containing anti-foam agents. Defoamers can be present at 0.05 to 5 volume percent, preferably 0.1 to 1 volume percent, based on the total volume of the formulation.

Colorants include pigments and dyes, and include materials such as nigrosine, Orasol blue GN, phthalocyanines, fluorescent dyes (e.g., Fluoral green gold dye), and any particulate material added solely for the purpose of imparting color to the formulation, e.g., carbon black, metal oxides (e.g., $Fe_2O_3$, titanium oxide). Colorants can be present at 0.05 to 5 volume percent, preferably 0.1 to 1 volume percent, based on the total volume of the formulation.

Thickening agents can be used to adjust the viscosity of a composition. Thickening agents include polyacrylic acid compounds, vegetable gums and cellulose based compounds, including polyacrylic acid, methyl cellulose, polyethyleneoxide, guar gum, locust bean gum, sodium carboxymethylcellulose, sodium alginate, and gum tragacanth. Thickening agents can be present at 0.05 to 5 volume percent, preferably 0.1 to 1 volume percent, based on the total volume of the formulation.

Release agents include silicone-based releasing agents, and polyethylenes, polypropylenes or polymethylpentene (TPX) polymers. Release agents can be present at 0.05 to 5 volume percent, preferably 0.1 to 1 volume percent, based on the total volume of the formulation.

The thermosetting polymer formulation can include one or more additional particulate fillers. Use of additional types of fillers allows the dielectric constant, dissipation factor, coefficient of thermal expansion, copper peel strength, and other properties of the formulation or circuit material to be fine-tuned. Examples of secondary particulate fillers include, without limitation, titanium dioxide (rutile and anatase), barium titanate, strontium titanate, silica (including fused amorphous silica), corundum, wollastonite, $Ba_2Ti_9O_{20}$, solid glass spheres, synthetic glass or ceramic hollow spheres, quartz, aluminum nitride, silicon carbide, beryllia, alumina, alumina trihydrate, magnesia, mica, talcs, nanoclays, and magnesium hydroxide. Other fillers that can be used include perfluorinated hydrocarbon polymers (i.e., TEFLON), thermoplastic polymers, or thermoplastic elastomers. A single secondary filler, or a combination of secondary fillers, can be used to provide a desired balance of properties. The fillers can be surface treated with a silicon-containing coating, for example, an organofunctional alkoxy silane coupling agent. Alternatively, a zirconate or titanate coupling agent can be used. Such coupling agents can improve the dispersion of the filler in the polymer and reduce water absorption of the finished composite circuit substrate. The total filler component used in the thermosetting polymer formulation can be 10 to 40 volume percent of the hexagonal boron nitride platelets and 1 to 10 volume percent of one or more fillers, preferably 1 to 5 volume percent of filler, based on the total volume of the composition of 100 percent. Fillers other than those listed here may be used, as known in the art.

The phrase "halogen-free" means the definition in IEC 61249-2-21 (2013) of 900 ppm maximum chlorine, 900 ppm maximum bromine, and 1500 ppm maximum total halogens; preferably no greater than 1000 ppm halogen, preferably no greater than 100 ppm halogen.

The thermosetting polymer systems are particularly useful in the manufacture of circuit materials. A circuit material is an article used in the manufacture of circuit laminates, circuit subassemblies, circuits, and multi-layer circuits, and includes dielectric substrates, bond plies, resin-coated conductive layers, dielectric layers, cover films, and subassemblies. A circuit laminate is a type of circuit subassembly that has a conductive layer, e.g., copper, fixedly attached to a dielectric substrate layer. Double clad circuit laminates have two conductive layers, one on each side of the dielectric substrate. Patterning a conductive layer of a laminate, for example by etching, provides a circuit. Multilayer circuits include a plurality of conductive layers, at least one of which contains a conductive wiring pattern. Multilayer circuits can be formed by laminating one or more circuits together using bond plies, by building up additional layers with coated conductive layers that are subsequently etched, or by building up additional layers by adding unclad dielectric layers followed by additive metallization. After forming a multi-layer circuit, known hole-forming and plating technologies can be used to produce useful electrical pathways between conductive layers.

In particular, the thermosetting polymer systems are useful in the manufacture of the dielectric substrates, bond plies, and the resin of the resin-coated conductive layers. The composition of the thermosetting polymer formulation can be adjusted to provide the desired dielectric or other properties of the circuit material being manufactured.

In addition to the thermosetting polymer system, the dielectric substrates (or in some embodiments, bond plies) can further include a nonwoven or woven, thermally stable web reinforcement comprising a suitable fiber, specifically glass (E, S, and D glass) or high temperature polyester fibers. Such thermally stable web reinforcement provides a means of controlling shrinkage upon cure within the plane of the dielectric substrate or bond ply. In addition, the use of the web reinforcement provides a circuit material with a relatively high mechanical strength. Reinforcement can also add to the dimensional stability of the system, and help control the coefficient of thermal expansion. When the circuit material is a bond ply, the web reinforcement can prevent the conductors on opposing layers from coming too close to each other causing low resistance, other reliability problems, and in the extreme, shorting. The web reinforcement also helps control the horizontal, i.e. X-Y, flow of the thermosetting polymer composition during lamination, which can result in incomplete fill between conductor lines, which in turn can lead to multiple problems in further circuit fabrication and use.

Useful conductive layers for the formation of the circuit materials including dielectric substrates and multi-layer dielectric substrates can include, without limitation, stainless steel, copper, gold, silver, aluminum, zinc, tin, lead, transition metals, and alloys comprising at least one of the foregoing, with copper being exemplary. There are no particular limitations regarding the thickness of each conductive layer, nor are there any limitations as to the shape, size, or texture of the surface of each conductive layer. Preferably however, each conductive layer has a thickness of from 3 micrometers to 200 micrometers, preferably from 9 micrometers to from 180 micrometers, preferably from 9 to 35 micrometers, preferably from 12 to 35 micrometers. When two or more conductive layers are present, the thickness of the two layers can be the same or different.

The conductive layer can be a copper layer. Suitable conductive layers include a thin layer of a conductive metal such as a copper foil presently used in the formation of circuits, for example, electrodeposited copper foils.

The dielectric constant of a dielectric layer can be less than or equal to 4.5, preferably less than or equal to 4.0, each measured over 1 MHz to 100 GHz. The in-plane thermal conductivity of a dielectric layer can be greater than 0.5 Watts/meter·Kelvin, preferably greater than 2.0 Watts/meter·Kelvin. A dielectric layer can have a z-axis thermal conductivity of 0.5 to 1.5 Watts/meter·Kelvin. A dielectric layer can have any thickness that maintains the desired properties, preferably less than or equal to 3.0 mils, preferably less than or equal to 2.5 mils, preferably less than or equal to 2.2 mils, preferably less than or equal to 2.0 mils, preferably 0.1 to 2.0 mils.

The circuit materials can be formed by means known in the art. In the formation of a dielectric substrate, bond ply, or resin-coated conductive layer, a solvent can optionally be present to adjust the viscosity of the thermosetting polymer formulation. Examples of the solvent include alcohols, such as methanol, ethanol, propanol, and butanol, ethers, such as 2-methoxyethanol, ethylene glycol monoethyl ether, ethylene glycol monobutyl ether, diethylene glycol, diethylene glycol monoethyl ether, and diethylene glycol monobutyl ether, ketones, such as acetone, methyl ethyl ketone, 2-pentanone, 2-hexanone, methyl isobutyl ketone, isophorone, and cyclohexanone, esters, such as methyl acetate, ethyl acetate, propyl acetate, butyl acetate, isobutyl acetate, ethylene glycol monoethyl ether acetate, propylene glycol monomethyl ether acetate, and diethylene glycol monoethyl ether acetate, aromatic compounds, such as toluene and xylene, and mixed solvents of two or more thereof. Particularly, polar solvents, such as ketones and esters, that have good epoxy resin solubility properties, can be preferably used.

The particular choice of processing conditions can depend on the thermosetting polymer system selected. As an example, dielectric substrate, bond ply, or resin layer can be cast using conventional methods. Thus, a layer of the viscosity-adjusted casting mixture can be cast on a carrier or a layer of a conductive material by, e.g., dip coating, reverse roll coating, knife-over-roll, knife-over-plate, or metering rod coating. Examples of carriers can include metallic films, polymeric films, or ceramic films. Specific examples of carriers include stainless steel foil, polyimide films, polyester films, and fluoropolymer films. Conductive layers are described above. Alternatively, the casting mixture can be cast onto a glass web, or a glass web can be dip-coated. The carrier liquid and processing aids can be removed from the cast layer, for example, by evaporation and/or by thermal decomposition in order to consolidate the thermosetting polymer formulation. The layer of the thermosetting polymer formulation can be further heated to modify the physical properties of the layer, e.g., to B-stage the formulation, to sinter the thermoplastic polymer formulation or to cure and/or post cure the thermosetting polymer formulation to provide the dielectric layer.

The dielectric layer can be further processed as known in the art, for example laminated. The lamination process can entail placing one or more of the dielectric layers between one or two sheets of coated or uncoated conductive layers (an adhesive or bond ply layer can be disposed between at least one conductive layer and at least one dielectric layer). The conductive layer can be in direct contact with the dielectric layer or optional adhesive layer, specifically without an intervening layer, wherein an optional adhesive layer is less than 10 percent of the thickness of the dielectric layer. The layered material can then be placed in a press, e.g., a vacuum press, under a pressure and temperature and for duration of time suitable to bond the layers and form a laminate. Lamination and curing can be by a one-step process, for example using a vacuum press, or can be by a multi-step process. Particular lamination temperatures and pressures will depend upon the particular adhesive composition and the substrate composition, and are readily ascertainable by one of ordinary skill in the art without undue experimentation.

FIG. 1 shows an exemplary circuit subassembly, in particular a single clad laminate 110 comprising a conductive metal layer 112 disposed on and in contact with a dielectric layer 114. The dielectric layer 114 includes a thermosetting polymer formulation. An optional glass web (not shown) can be present in dielectric layer 114. It is to be understood that in all of the examples described herein, the various layers can fully or partially cover each other, and additional conductive layers, patterned circuit layers, and dielectric layers can be present. Optional adhesive (bond ply) layers (not shown) can be present, and can be uncured or partially cured. Many different multi-layer circuit configurations can be formed using the above substrates.

Figure 2:
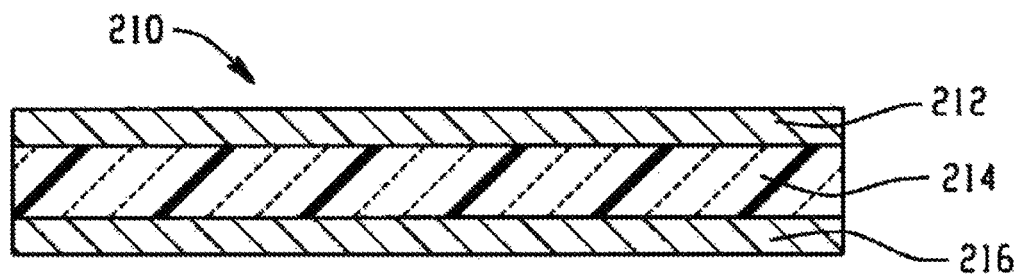
FIG. 2 is a schematic of a double clad laminate.

A multilayer circuit assembly is shown at 210 in FIG. 2. Double clad circuit layer 210 includes conductive layers 212, 216 disposed on opposite sides of a dielectric layer 214. Dielectric layer 214 can include a woven web (not shown). Multilayer circuit assembly 210 can be a three-layer bond ply including an intermediate layer 214 including a thermosetting polymer formulation, sandwiched between first outer layer 212 and second outer layer 216 including the thermosetting polymer formulation, wherein the thermosetting polymer formulation of the intermediate layer has a degree of cure that is greater than a degree of cure of each thermosetting polymer formulation of the outer layers. The thermosetting polymer formulation of the intermediate layer can have a degree of cure that is greater than the degree of cure of each of the thermosetting polymer formulations of the first and the second outer layers. For example, the intermediate layer can be fully cured, while the outer layers are cured to a lesser degree, such as a layer uncured or B-staged. "Disposed" means at least partial intimate contact between two layers and includes layers that partially or wholly cover each other.

A three-layer bond ply can include a release film layer. The release film layer can be applied and bonded to one or both of the outer layers by passing the three-layer bond ply and release film together through a heating roller at a temperature of about 20 to about 160° C., using a linear pressure of about 0.2 to about 20 kg/cm. Alternatively, an outer dielectric layer can be applied directly to the release layer and the combination subsequently laminated to the intermediate layer. Exemplary release film layers include, for example, polyethylene, polypropylene, polymethylpentene (TPX), or polyethylene terephthalate, coated, for example, with a silicone-based releasing agent, as well as paper sheets coated with a polyethylene, polypropylene, or TPX.

Figure 3:
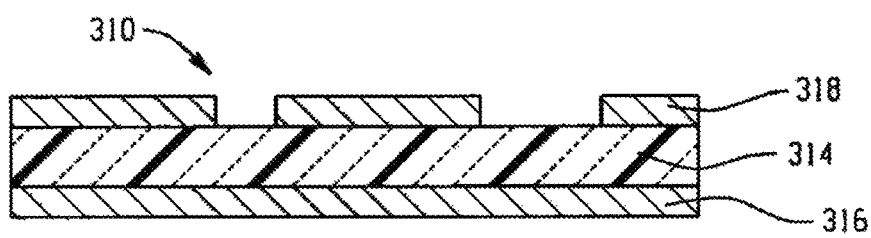
FIG. 3 is a schematic of a double clad laminate with patterned conductive layer.

A circuit subassembly 310 is shown in FIG. 3, with a circuit layer 318 and a conductive layer 316 disposed on opposite sides of a dielectric layer 314. Dielectric layer 314 can include a woven web (not shown).

Figure 4:
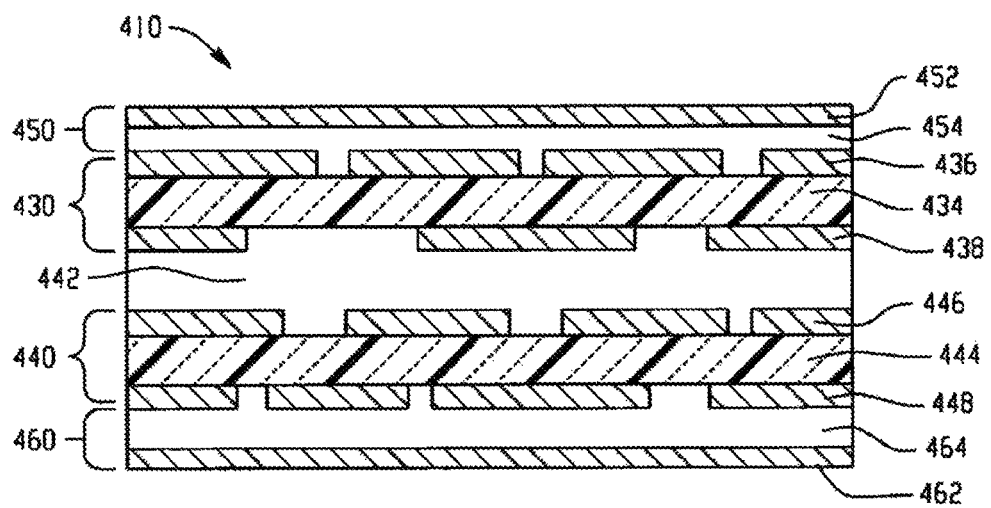
FIG. 4 is a schematic of an exemplary circuit assembly with two double clad dielectric substrates.

FIG. 4 shows an exemplary multilayer circuit assembly 410 with one or more circuit subassemblies. Multilayer circuit 410 has a first double clad circuit 430, a second double clad circuit 440, and a bond ply 442 disposed there between. Bond ply 442 is shown as a three-layer bond ply. Double clad circuit 430 includes a dielectric substrate 434 disposed between two conductive circuit layers 436, 438. Double clad circuit 440 includes a dielectric substrate 444 disposed between two conductive circuit layers 446, 448. The three-layer bond ply 442 is configured to adhere the two double-clad circuits together to form the multilayer circuit 410. Each dielectric layer 434, 444 can include a nonwoven glass reinforcement (not shown). Two cap layers 450, 460 are also shown. Each cap layer 450, 460, includes a conductive layer 452, 462 disposed on a bond ply layer 454, 464. The bond ply layers 454, 464 can be single layer bond plies or they can be three-layer bond plies.

Figure 5:
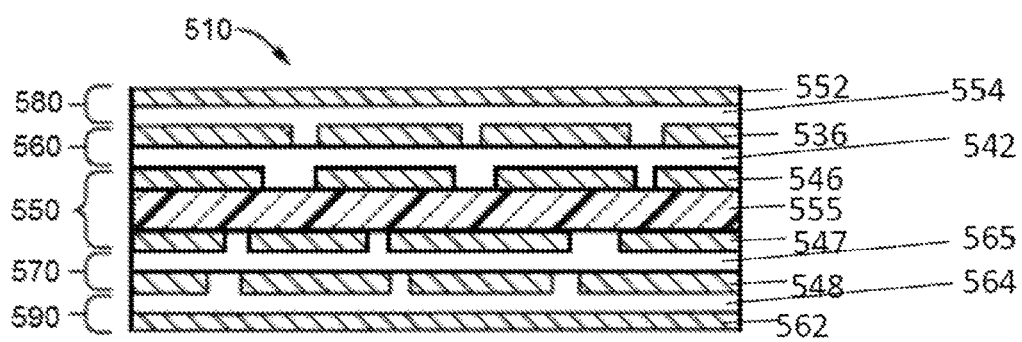
FIG. 5 is a schematic of an exemplary circuit assembly with sequential lamination.

FIG. 5 shows an exemplary multilayer circuit assembly 510 having one or more circuit subassemblies. Multilayer circuit 510 has first a double clad circuit 550 disposed between two layers 560, 570. Double clad circuit includes dielectric substrate 555 disposed between conductive circuit layers 546, 547. The entire multilayer subassembly is disposed between two more layers 580, 590. The layers 560, 570, 580, and 590 each consist of one or more dielectric bond plies 554, 542, 565, 564, disposed between a conductive ply 552, 536, 548, 562.

The invention is further illustrated by the following non-limiting Examples.

EXAMPLES

Example formulations as listed in Table 2 were prepared. The polymer and additives were mixed with an appropriate solvent under low shear mixing. Next, the filler was slowly added while low shear mixing continued. Mixes were coated onto a pre-cut sheet of woven fiberglass at a specified weight percent polymer content and b-staged in an oven. Finally, between one and five plies were laminated between two layers of copper foil under heat and pressure.

The formulations were tested to determine the in-plane thermal conductivity (TC) and the dielectric constant (Dk). Samples were tested for physical and chemical properties using methods found in the IPC-650 test method manual as shown in Table 1 below.

TABLE 1

| Property | Test method |
| --- | --- |
| Electrical Strength (E.S.) | IPC-TM-650 2.5.6.2 |
| Thermal Conductivity (TC) | IPC-TM-650 2.4.50 |
| Peel strength | IPC-TM-650 2.4.8 |
| Dielectric constant (Dk) | IPC-TM-650 2.5.5 |
| Dissipation factor (Df) | IPC-TM-650 2.5.5 |

TABLE 2

| Sample | Polymer | Filler | Amount Filler (parts filler per hundred polymer) | TC |
| --- | --- | --- | --- | --- |
| 1 | Cyanate Ester | Boron Nitride Platelets and $SiO_2$ (50/50 mixture) | 93 | 0.756 |
| 2 | Cyanate Ester | Agglomerates of Boron Nitride (hBN) | 133 | 1.05 |
| 3 | Cyanate Ester | Platelets of Boron Nitride (hBN) | 35 | 1.15 |
| 4 | Epoxy | Platelets of Boron Nitride (hBN) | 70 | 1.2 |

Sample 3 had a low volume of hBN, but an unexpectedly high thermal conductivity.

Additional formulations as listed in Table 3 were prepared and the in-plane thermal conductivity of the formulations was tested.

TABLE 3

| | Wt % |
| --- | --- |
| Sample 5 | |
| Cyanate-Ester Polymer | 47 |
| Boron Nitride Filler | 28 |
| Woven Fiberglass | 25 |
| In-plane Thermal Conductivity (Watts/meter-Kelvin) | 3.2 |

TABLE 3-continued

| | Wt % |
|---|---|
| Sample 6 | |
| Epoxy polymer | 47 |
| Boron Nitride Platelets | 33 |
| Woven Fiberglass | 20 |
| In-Plane Thermal Conductivity (Watts/meter · Kelvin) | 2.8 |

It was seen that good in-plane thermal conductivity can be obtained using both cyanate-ester and epoxy thermosetting polymer formulations.

Thermally conductive formulations using boron nitride to partially or totally replace silica in the formulations were prepared as listed in Tables 4 and 5. Thin prepregs using 104 and 106 fiberglass to achieve 2 to 4 mil thicknesses were prepared. The prepreg coating properties (cosmetics, pinholes, dryness, flow) were assessed and peel strength, electrical strength, and dielectric constant (Dk), and dissipation factor (Df) were measured.

TABLE 4

| Sample | Polymer | Fiber Glass | Polymer content wt % | Filler Loading (-parts filler per hundred polymer) | Electrical Strength [V/mil] | Thermal Conductivity [W/m · K] | Peel Strength [lb/in] | Dk | Df |
|---|---|---|---|---|---|---|---|---|---|
| 7 | Epoxy | 104 | 85% | 30 | 735 | 0.89 | 5.5 | — | — |
| 8 | Epoxy | 104 | 83% | 35 | 914 | 1.18 | 4.2 | — | — |
| 9 | Epoxy | 104 | 85% | 35 | 877 | 1.15 | 5.3 | — | — |
| 10 | Epoxy | 104 | 87% | 35 | 1036 | 1.16 | 5.0 | — | — |
| 11 | Epoxy | 104 | 85% | 44 | 887 | 1.26 | 3.8 | | |
| 12 | Epoxy | 104 | 88% | 44 | 1013 | 1.08 | 4.4 | — | — |
| 13 | Epoxy | 104 | 89% | 44 | 1078 | 1.23 | 4.0 | — | — |
| 14 | Epoxy | 104 | 78% | 35 | 1839 | 0.95 | 4.5 | 3.89 | 0.012 |

TABLE 5

| Sample | Fiber Glass | Filler | Filler parts per hundred parts polymer | TC |
|---|---|---|---|---|
| 15 | 106 | 50/50 mixture hBN platelets and SiO$_2$ | 93 | 0.756 |
| 16 | 106 | hBN agglomerates | 133 | 1.054 |
| 17 | 106 | hBN platelets and agglomerates | 120 | 1.122 |

It was observed that good properties can be obtained using low amounts of fillers.

The thermosetting polymer formulation, dielectric layer including a thermosetting polymer formulation, circuit materials including a dielectric layer, and other aspects are further illustrated by the following embodiments, which are non-limiting.

Embodiment 1

A thermosetting polymer formulation, comprising: 40 to 90 volume percent of a thermosetting polymer system; 10 to 40 volume percent, preferably 20 to 35 volume percent, preferably 20 to 30 volume percent, of a plurality of hexagonal boron nitride platelets having a mean particle diameter of 5 to 20 micrometers, preferably 8 to 15 micrometers, and a D10 particle diameter of 3 to 7 micrometers, preferably 3 to 5 micrometers, and a D90 particle diameter of 20 to 30 micrometers, preferably 25 to 30 micrometers; a total of 0.01 to 10 volume percent of a coupling agent, an impact modifier, a curing agent, a defoamer, a colorant, a thickening agent, a release agent, an accelerator, or a combination comprising at least one of the foregoing.

Embodiment 2

The formulation of Embodiment 1, comprising more than 60 volume percent of the thermosetting polymer system.

Embodiment 3

The formulation of Embodiment 1 or 2, wherein the thermosetting polymer system comprises a butadiene, an isoprene, a bis-maleimide, a styrene-maleic anhydride copolymer, an epoxy, a polyurethane prepolymer composition, a cyanate ester, a styrene butadiene copolymer, a benzoxazine, or a combination comprising at least one of the foregoing.

Embodiment 4

The formulation of any one or more of the preceding Embodiments, wherein the thermosetting polymer system is a thermosetting epoxy system comprising, 40 to 99 volume percent of an epoxy resin component; and 15 to 60 volume percent of a curing system.

Embodiment 5

The formulation of any one or more of the preceding Embodiments, wherein the thermosetting polymer system comprises a liquid epoxy resin and a phenolic curing system.

Embodiment 6

The formulation of any one or more of the preceding Embodiments, comprising 35 to 45 volume percent of an epoxy resin component; 18 to 26 volume percent of a curing system; 25 to 40 volume percent of a plurality of hexagonal boron nitride platelets; 1 to 5 volume percent of an impact modifier; 0.5 to 1.5 volume percent of a curing agent; 0.2 to 0.9 volume percent of an accelerator; and 0.2 to 0.6 volume percent of a coupling agent.

Embodiment 7

A dielectric layer for the manufacture of a dielectric substrate, the dielectric layer comprising: a thermosetting polymer system; and 10 to 40 volume percent, preferably 20 to 35 volume percent, preferably 20 to 30 volume percent, based on the total volume of the dielectric layer, of a plurality of hexagonal boron nitride platelets having a mean particle diameter of 5 to 20 micrometers, preferably 8 to 15 micrometers, and a D10 particle diameter of 3 to 7 micrometers, preferably 3 to 5 micrometers, and a D90 particle diameter of 20 to 30 micrometers, preferably 25 to 30 micrometers; wherein after full cure of the dielectric layer, the dielectric layer has a dielectric constant of less than or equal to 4.5, preferably less than or equal to 4.0, measured over 1 MHz to 100 GHz; an in-plane thermal conductivity of greater than 0.5 Watts/meter·Kelvin, preferably greater than 2.0 Watts/meter·Kelvin; a z-axis thermal conductivity of 0.5 to 1.5 Watts/meter·Kelvin; and a thickness of less than or equal to 3.0 mils, preferably less than or equal to 2.5 mils, preferably less than or equal to 2.2 mils, preferably less than or equal to 2.0 mils, preferably 0.1 to 2.0 mils.

Embodiment 8

The dielectric layer of Embodiment 7, wherein the dielectric layer is halogen-free.

Embodiment 9

The dielectric layer of Embodiment 7 or 8, wherein the fully cured dielectric layer has a UL rating of V-0.

Embodiment 10

The dielectric layer of any one or more of Embodiments 7 to 9, wherein the thermosetting polymer system comprises a butadiene, an isoprene, a bis-maleimide, a styrene-maleic anhydride copolymer, an epoxy, a polyurethane prepolymer composition, a cyanate ester, a styrene butadiene copolymer, a benzoxazine, or a combination comprising at least one of the foregoing.

Embodiment 11

The dielectric layer of any one or more of Embodiments 7 to 10, wherein the thermosetting polymer system is a thermosetting epoxy system comprising, based on the total volume of the thermosetting polymer system, 40 to 99 volume percent of an epoxy resin component; and 15 to 60 volume percent of a curing system.

Embodiment 12

The dielectric layer of any one or more of Embodiments 7 to 11, wherein the thermosetting polymer system comprises a liquid epoxy resin and a phenolic curing system.

Embodiment 13

The dielectric layer of any one or more of Embodiments 7 to 12, further comprising a total of 0.01 to 10 volume percent of a coupling agent, an impact modifier, a curing agent, a defoamer, a colorant, a thickening agent, a release agent, an accelerator, or a combination comprising at least one of the foregoing.

Embodiment 14

The dielectric layer of any one or more of Embodiments 7 to 13, wherein the thermosetting polymer composition is partially cured.

Embodiment 15

The dielectric layer of any one or more of Embodiments 7 to 13, wherein the thermosetting polymer composition is fully cured.

Embodiment 16

A circuit subassembly, comprising an electrically conductive layer disposed on the dielectric layer of any one or more of Embodiments 7 to 15.

Embodiment 17

The circuit subassembly of Embodiment 16, wherein the conductive layer comprises copper.

Embodiment 18

The circuit subassembly of Embodiment 16, wherein the conductive layer is in the form of a patterned circuit.

Embodiment 19

A bond ply for a circuit subassembly comprising: a first outer layer comprising a thermosetting polymer formulation; a second outer layer comprising a thermosetting polymer formulation that is of the same type as that of the first outer layer; and an intermediate layer disposed between the first and the second outer layers, and comprising a thermosetting polymer formulation that is of the same type as the first and second outer layers; wherein the thermosetting polymer formulation comprises: 40 to 90 volume percent of a thermosetting polymer system; 10 to 40 volume percent, preferably 20 to 35 volume percent, preferably 20 to 30 volume percent, based on the total volume of the dielectric layer, of a plurality of hexagonal boron nitride platelets having a mean particle diameter of 5 to 20 micrometers, preferably 8 to 15 micrometers, and a D10 particle diameter of 3 to 7 micrometers, preferably 3 to 5 micrometers, and a D90 particle diameter of 20 to 30 micrometers, preferably 25 to 30 micrometers; a total of 0.01 to 10 volume percent of a coupling agent, an impact modifier, a curing agent, a defoamer, a colorant, a thickening agent, a release agent, an accelerator, or a combination comprising at least one of the foregoing; wherein the thermosetting polymer formulation of the intermediate layer has a degree of cure that is different than a degree of cure for each of the thermosetting polymer formulations of the first and the second outer layers.

Embodiment 20

A circuit comprising the circuit subassembly of any one or more of Embodiments 16 to 18.

Embodiment 21

A multilayer circuit comprising the circuit subassembly of Embodiment 20.

Embodiment 22

A handheld device comprising the circuit of Embodiment 20 or the multilayer circuit of Embodiment 21.

Embodiment 23

A method of manufacture of a circuit subassembly, comprising disposing the dielectric layer of any one or more of Embodiments 7 to 15 onto a conductive layer; and partially or fully curing the dielectric layer.

In general, the invention may alternatively comprise, consist of, or consist essentially of, any appropriate components herein disclosed. The invention may additionally, or alternatively, be formulated so as to be devoid, or substantially free, of any components, materials, ingredients, adjuvants or species used in the prior art compositions or that are otherwise not necessary to the achievement of the function and/or objectives of the present invention.

The compositions, methods, and articles can alternatively comprise, consist of, or consist essentially of, any appropriate components or steps herein disclosed. The compositions, methods, and articles can additionally, or alternatively, be formulated so as to be devoid, or substantially free, of any components, materials, ingredients, adjuvants or species used in the prior art compositions or that are otherwise not necessary to the achievement of the function and/or objectives of the compositions, methods, and articles.

All ranges disclosed herein are inclusive of the endpoints, and the endpoints are independently combinable with each other. "Combination" is inclusive of blends, mixtures, alloys, or reaction products. Furthermore, the terms "first," "second," etc., herein do not denote any order, quantity, or importance, but rather are used to denote one element from another. The terms "a" and "an" and "the" herein do not denote a limitation of quantity, and are to be construed to cover both the singular and the plural, unless otherwise indicated herein or clearly contradicted by context. "Or" means "and/or" unless clearly stated otherwise. It is to be understood that the described elements may be combined in any suitable manner in the various embodiments.

"Alkyl" as used herein refers to hydrocarbyl groups having 1-20 carbon atoms, preferably 2-10 carbon atoms; and "substituted alkyl" includes alkyl groups further having one or more hydroxy, alkoxy (of a lower alkyl group), mercapto (of a lower alkyl group), cycloalkyl, substituted cycloalkyl, heterocyclic, substituted heterocyclic, aryl, substituted aryl, heteroaryl, substituted heteroaryl, aryloxy, substituted aryloxy, halogen, trifluoromethyl, cyano, nitro, nitrone, amino, amido, C(O)H, acyl, oxyacyl, carboxyl, carbamate, sulfonyl, sulfonamide, or sulfuryl substituents. "Lower alkyl" refers to hydrocarbyl radicals having 1-6 carbon atoms, preferably 1-4 carbon atoms; and "substituted lower alkyl" includes lower alkyl groups further having one or more substituents as described herein. "Alkylene" refers to divalent hydrocarbyl groups having 1-20 carbon atoms, preferably 2-10 carbon atoms; and "substituted alkylene" includes alkylene groups further having one or more substituents as set forth above. "Cycloalkylene" refers to divalent cyclic ring-containing groups containing 3-8 carbon atoms, and "substituted cycloalkylene" refers to cycloalkylene groups further having one or more substituents as set forth above. "Arylene" refers to divalent aromatic groups having 6 up to 14 carbon atoms and "substituted arylene" refers to arylene groups further having one or more substituents as set forth above. "Polyarylene" refers to a divalent moiety comprising a plurality (i.e., at least two, up to 10) divalent aromatic groups (each having 6 up to 14 carbon atoms), wherein said divalent aromatic groups are linked to one another directly, or via a 1-3 atom linker; and "substituted polyarylene" refers to polyarylene groups further having one or more substituents as set forth above. "Heteroarylene" refers to divalent aromatic groups containing one or more heteroatoms (e.g., N, O, P, S, or Si) as part of the ring structure, and having 3 up to 14 carbon atoms; and "substituted arylene" refers to arylene groups further having one or more substituents as set forth above. "Polyheteroarylene" refers to a divalent moiety comprising 2-4 heteroarylene groups (each containing at least one heteroatom, and 3-14 carbon atoms), wherein the heteroarylene groups are linked to one another directly, or via a 1-3 atom linker; and "substituted polyheteroarylene" refers to polyheteroarylene groups further having one or more substituents as set forth above.

All references are incorporated herein by reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

I claim:

1. A thermosetting polymer formulation, comprising:
    40 to 90 volume percent of a thermosetting polymer system;
    10 to 40 volume percent of a plurality of hexagonal boron nitride platelets having a mean particle diameter of 5 to 20 micrometers, and a D10 particle diameter of 3 to 7 micrometers, and a D90 particle diameter of 20 to 30 micrometers;
    a total of 0.01 to 10 volume percent of a coupling agent, an impact modifier, a curing agent, a defoamer, a colorant, a thickening agent, a release agent, an accelerator, or a combination comprising at least one of the foregoing.

2. The formulation of claim 1, comprising more than 60 volume percent of the thermosetting polymer system.

3. The formulation of claim 1, wherein the thermosetting polymer system comprises a butadiene, an isoprene, a bismaleimide, a styrene-maleic anhydride copolymer, an epoxy, a polyurethane prepolymer composition, a cyanate ester, a styrene butadiene copolymer, a benzoxazine, or a combination comprising at least one of the foregoing.

4. The formulation of claim 1, wherein the thermosetting polymer system is a thermosetting epoxy system comprising
    15 to 85 volume percent of a liquid epoxy resin component; and
    15 to 60 volume percent of a phenolic curing system.

5. The formulation of claim 1, comprising
    35 to 45 volume percent of an epoxy resin component;
    18 to 26 volume percent of a curing system;
    25 to 40 volume percent of a plurality of hexagonal boron nitride platelets;
    1 to 5 volume percent of an impact modifier;
    0.5 to 1.5 volume percent of a curing agent;
    0.2 to 0.9 volume percent of an accelerator; and
    0.2 to 0.6 volume percent of a coupling agent, wherein the volume percentages are based on the total volume of the formulation.

6. The thermosetting polymer formulation of claim 1, comprising:
    20 to 35 volume percent of the plurality of hexagonal boron nitride platelets.

7. The thermosetting polymer formulation of claim 1, comprising:
    20 to 30 volume percent of the plurality of hexagonal boron nitride platelets.

8. The thermosetting polymer formulation of claim 1, wherein the plurality of hexagonal boron nitride platelets has a mean particle diameter of 8 to 15 micrometers.

9. The thermosetting polymer formulation of claim 1, wherein the plurality of hexagonal boron nitride platelets has a D10 particle diameter of 3 to 5 micrometers.

10. The thermosetting polymer formulation of claim 1, wherein the plurality of hexagonal boron nitride platelets has a D90 particle diameter of 25 to 30 micrometers.

11. A dielectric layer for the manufacture of a dielectric substrate, the dielectric layer comprising:
a thermosetting polymer system; and
10 to 40 volume percent, based on the total volume of the dielectric layer, of a plurality of hexagonal boron nitride platelets having a mean particle diameter of 5 to 20 micrometers, and a D10 particle diameter of 3 to 7 micrometers, and a D90 particle diameter of 20 to 30 micrometers;
wherein after full cure of the dielectric layer, the dielectric layer has
a dielectric constant of less than or equal to 4.5, measured over 1 MHz to 100 GHz;
an in-plane thermal conductivity of greater than 0.5 Watts/meter·Kelvin;
a z-axis thermal conductivity of 0.5 to 1.5 Watts/meter·Kelvin; and
a thickness of less than or equal to 3.0 mils.

12. The dielectric layer of claim 11, wherein the dielectric layer is halogen-free or wherein the fully cured dielectric layer has a UL rating of V-0.

13. The dielectric layer of claim 11, wherein the thermosetting polymer system comprises a butadiene, an isoprene, a bis-maleimide, a styrene-maleic anhydride copolymer, an epoxy, a polyurethane prepolymer composition, a cyanate ester, a styrene butadiene copolymer, a benzoxazine, or a combination comprising at least one of the foregoing.

14. The dielectric layer of claim 11, wherein the thermosetting polymer system is a thermosetting epoxy system comprising,
40 to 99 volume percent of an epoxy resin component; and
15 to 60 volume percent of a curing system.

15. The dielectric layer of claim 11, wherein the thermosetting polymer system comprises a liquid epoxy resin and a phenolic curing system.

16. The dielectric layer of claim 11, further comprising a total of 0.01 to 10 volume percent of a coupling agent, an impact modifier, a curing agent, a defoamer, a colorant, a thickening agent, a release agent, an accelerator, or a combination comprising at least one of the foregoing.

17. The dielectric layer of claim 11, wherein the thermosetting polymer composition is partially cured or fully cured.

18. A circuit subassembly, comprising an electrically conductive layer disposed on the dielectric layer of claim 11.

19. The circuit subassembly of claim 18, wherein the conductive layer comprises copper, or wherein the conductive layer is in the form of a patterned circuit.

20. A method of manufacture of a circuit subassembly, comprising disposing the dielectric layer of claim 11 onto a conductive layer; and partially or fully curing the dielectric layer.

21. The dielectric layer of claim 11, wherein after full cure of the dielectric layer, the dielectric layer has a dielectric constant of less than or equal to 4.0, measured over 1 MHz to 100 GHz;
an in-plane thermal conductivity of greater than 2.0 Watts/meter-Kelvin; and
a thickness of less than or equal to 2.5 mils.

22. The dielectric layer of claim 11, wherein after full cure of the dielectric layer, the dielectric layer has a thickness of less than or equal to 2.2 mils.

23. The dielectric layer of claim 11, wherein after full cure of the dielectric layer, the dielectric layer has a thickness of less than or equal to 2.0 mils.

24. The dielectric layer of claim 11, wherein after full cure of the dielectric layer, the dielectric layer has a thickness of 0.1 to 2.0 mils.

25. A bond ply for a circuit subassembly comprising:
a first outer layer comprising a thermosetting polymer formulation;
a second outer layer comprising a thermosetting polymer formulation that is of the same type as that of the first outer layer; and
an intermediate layer disposed between the first and the second outer layers, and comprising a thermosetting polymer formulation that is of the same type as the first and second outer layers;
wherein the thermosetting polymer formulation comprises:
40 to 90 volume percent of a thermosetting polymer system;
10 to 40 volume percent, based on the total volume of the dielectric layer, of a plurality of hexagonal boron nitride platelets having a mean particle diameter of 5 to 20 micrometers, and a D10 particle diameter of 3 to 7 micrometers, and a D90 particle diameter of 20 to 30 micrometers;
a total of 0.01 to 10 volume percent of a coupling agent, an impact modifier, a curing agent, a defoamer, a colorant, a thickening agent, a release agent, an accelerator, or a combination comprising at least one of the foregoing;
wherein the thermosetting polymer formulation of the intermediate layer has a degree of cure that is different than a degree of cure for each of the thermosetting polymer formulations of the first and the second outer layers.

26. A circuit comprising the circuit subassembly of claim 25.

27. A multilayer circuit comprising the circuit subassembly of claim 25.

28. A handheld device comprising either the circuit of claim 25.

29. A handheld device comprising the multilayer circuit of claim 27.

30. The bond ply of claim 25, comprising:
20 to 35 volume percent of the plurality of hexagonal boron nitride platelets.

31. The bond ply of claim 25, comprising:
20 to 30 volume percent of the plurality of hexagonal boron nitride platelets.

32. The bond ply of claim 25, wherein the plurality of hexagonal boron nitride platelets has a mean particle diameter of 8 to 15 micrometers.

33. The bond ply of claim 25, wherein the plurality of hexagonal boron nitride platelets has a D10 particle diameter of 3 to 5 micrometers.

34. The bond ply of claim 25, wherein the plurality of hexagonal boron nitride platelets has a D90 particle diameter of 25 to 30 micrometers.

* * * * *